United States Patent
Kuo et al.

(10) Patent No.: US 9,134,368 B2
(45) Date of Patent: Sep. 15, 2015

(54) CONTACTLESS WAFER PROBING WITH IMPROVED POWER SUPPLY

(75) Inventors: Yung-Hsin Kuo, Zhubei (TW); Po-Yi Huang, Kaohsiung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 574 days.

(21) Appl. No.: 13/465,142

(22) Filed: May 7, 2012

(65) Prior Publication Data

US 2013/0293253 A1 Nov. 7, 2013

(51) Int. Cl.
*G01R 31/302* (2006.01)
*H01L 23/58* (2006.01)
*G01R 31/3185* (2006.01)

(52) U.S. Cl.
CPC ............ *G01R 31/3025* (2013.01); *H01L 23/58* (2013.01); *G01R 31/318511* (2013.01); *H01L 2924/0002* (2013.01)

(58) Field of Classification Search
CPC .......... G01R 31/3025; G01R 31/2889; G01R 31/2851
USPC ............. 324/750.16–762.06, 757.04, 754.21; 257/48; 438/14–18
See application file for complete search history.

(56) References Cited

U.S. PATENT DOCUMENTS

| | | | |
|---|---|---|---|
| 6,448,801 B2 * | 9/2002 | Dischiano | 324/762.01 |
| 6,759,863 B2 | 7/2004 | Moore | |
| 7,325,180 B2 * | 1/2008 | Pileggi et al. | 714/724 |
| 2005/0174131 A1 * | 8/2005 | Miller | 324/754 |
| 2008/0204055 A1 * | 8/2008 | Pagani | 324/750 |
| 2012/0126846 A1 * | 5/2012 | Jong et al. | 324/762.03 |

\* cited by examiner

*Primary Examiner* — Melissa Koval
*Assistant Examiner* — Daniel Miller
(74) *Attorney, Agent, or Firm* — Eschweiler & Associates, LLC

(57) ABSTRACT

Some embodiments relate to an integrated circuit. The integrated circuit includes an inductive or capacitive wireless communication structure located on a die region of the integrated circuit. This wireless communication structure is configured to wirelessly receive a test stimulus vector to test circuitry on the die region. The integrated circuit also includes a landing region having a size and location suitable to allow a conductive needle or conductive probe to come into direct physical and electrical contact with the landing region. The landing region provides a DC power supply to the circuitry on the die region while the test stimulus vector is wirelessly received.

17 Claims, 4 Drawing Sheets

CONTACTLESS WAFER PROBING WITH IMPROVED POWER SUPPLY

BACKGROUND

Modern integrated circuits often include millions of semiconductor devices, such as transistors, that are collectively capable of performing complex functionality. To ensure the end integrated circuits function properly before being distributed to customers, automatic test equipment performs integrated circuit testing prior to shipment of the integrated circuits.

As will be appreciated in greater detail below, the present disclosure relates to improved automatic test techniques for integrated circuits.

DETAILED DESCRIPTION

Figure 1:
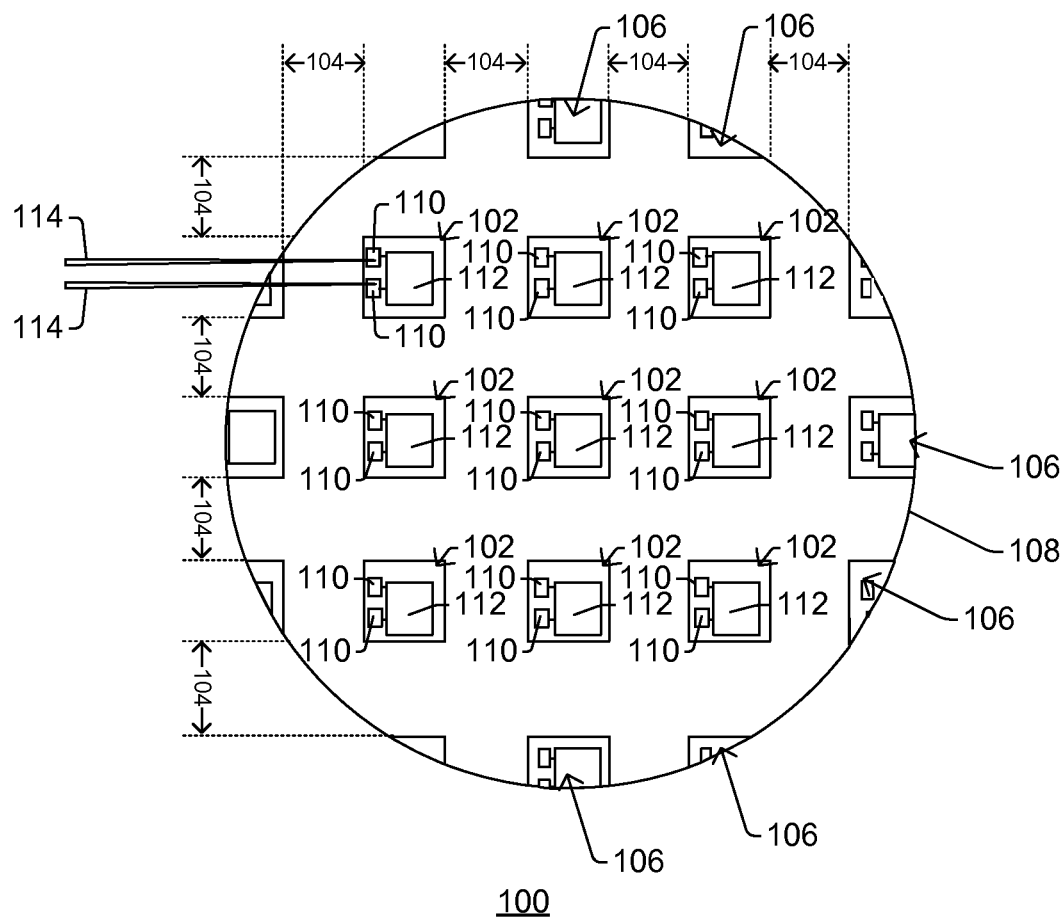
FIG. 1 illustrates a conventional automated test equipment technique that makes use of conductive needles and which suffers from some shortcomings.

The present invention will now be described with reference to the attached drawing figures, wherein like reference numerals are used to refer to like elements throughout, and wherein the illustrated structures and devices are not necessarily drawn to scale.

FIG. 1 shows a semiconductor wafer 100 that includes multiple die 102 arranged in a grid-like layout, with scribe lines 104 running between neighboring die 102. Note that for ease of understanding the width of the scribe lines 104 relative to the size of the die 102 may be somewhat exaggerated in FIG. 1, compared to typical implementations. Edge die 106, which include less than a full die, can be arranged around the wafer's outer circumference 108. During manufacturing, multiple conducting and insulating layers are built up on each die 102. After the build-up of these layers is complete, the wafer 100 is cut along the scribe lines 104 to separate the die 102 from one another. After dicing, the separated die are packaged to form integrated circuits that are suitable for electric products, such as computing devices, communication devices, and the like.

To help ensure that integrated circuit structures 112 on the respective die 102 exhibit proper functionality, the die 102 include landing regions 110, such as conductive test pads or conductive bumps for example. Conventional automated test equipment includes thin metal needles 114 that are pressed onto the landing regions 110. While these needles 114 are pressed onto the landing regions 110, the automated test equipment can then apply predetermined voltages and/or currents to the integrated circuit structures 112 via the needles 114, wherein the voltages and/or currents correspond to stimulus test vectors (e.g., digital bit patterns or analog waveforms that are expected to yield predetermined results from the integrated circuit structures 112). Although these metal needles 114 are sufficient in many regards for existing technology nodes, they require repeated cleaning to limit contamination and wafer defects. This repeated cleaning adds expense and/or limits throughput. Moreover, as feature sizes shrink in successive generations of technology, the landing regions 110, which have a footprint that is set based on the relatively fixed physical geometries of the metal needles 114, may take up an area corresponding to an ever larger number of devices on a die.

To resolve some issues with needle-based automated test equipment, automated test equipment that uses only wireless signals has also been developed. Unfortunately, however, automated test equipment that uses only wireless signals also suffers from some shortcomings. In particular, it is difficult to wirelessly deliver DC power to integrated circuit structures on the wafer in an efficient manner. For example, attempting to wirelessly transfer VDD and VSS voltages to power rails of the die can result in features on the die being melted, scorched, or otherwise damaged in many instances.

Figure 2:
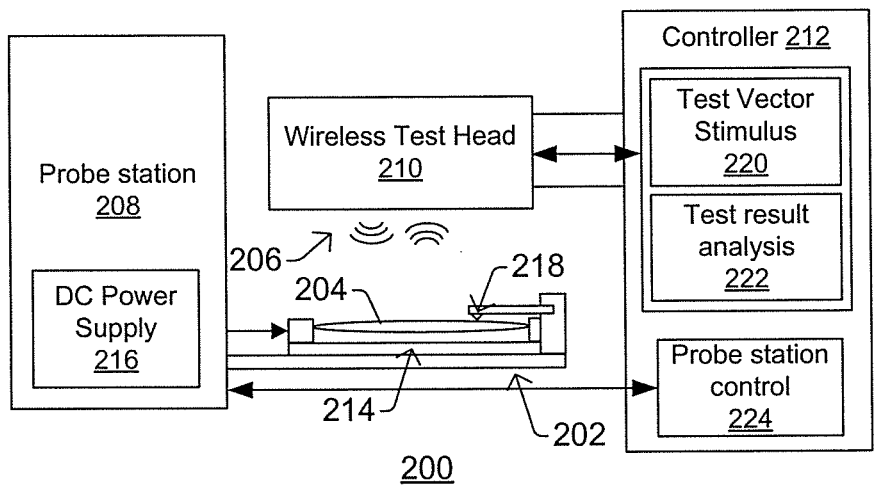
FIG. 2 shows exemplary automated test equipment in accordance with some embodiments.

Therefore, the present disclosure provides for improved automated testing techniques. FIG. 2 shows an exemplary embodiment of automated test equipment 200 in accordance with some aspects of this disclosure. The automated test equipment 200 uses a conductive powerline 202 to transfer power to integrated circuit structures on the wafer 204, and at the same time uses wireless communication modules 206 to wirelessly communicate test stimulus vectors and/or test results to and/or from the integrated circuit structures on wafer 204. In this hybrid approach, the use of wireless communication modules 206 limit the need for test needles (which correspondingly limits wafer defects and needle cleaning costs); while the conductive powerline 202 provides for a reliable power connection to the die (which correspondingly limits melting or scorching of the wafer 204). Therefore, this hybrid approach promotes efficient manufacturing and good yields.

More particularly, automated test equipment 200 includes a probe station 208 and a wireless test head 210, which operate under the direction of a controller 212. The probe station 208 can include a stage 214, such as an electrostatic chuck, clamp, or gripper for example, to retain semiconductor wafer 204. The probe station 208 also includes a DC power supply 216 to provide a DC operating power (e.g., VDD and Ground) suitable for powering devices on the wafer 204. A power conduit 218, such as a wire, conductive needle, conductive probe, or other conductive body, for example, is placed in physical and electrical contact with a surface of the wafer 204. A test vector stimulus module 220, test result analysis module 222, and probe station control module 224 are also included.

Figure 3:
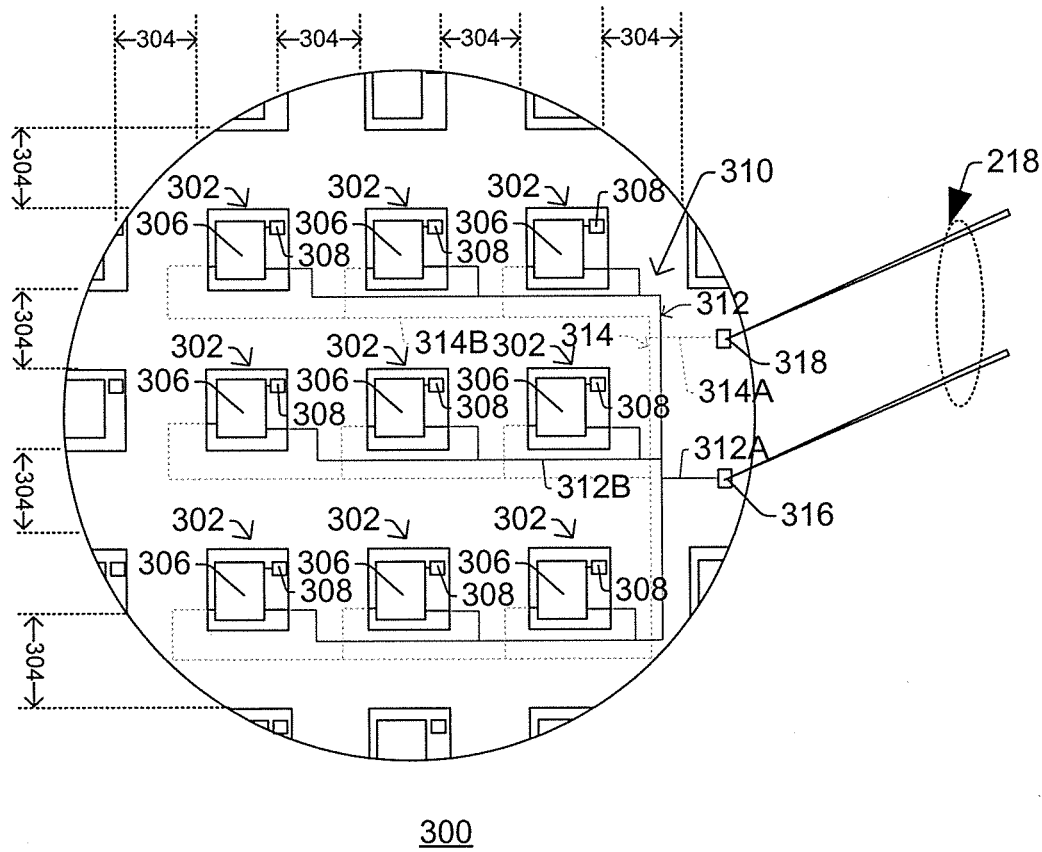
FIG. 3 shows a semiconductor wafer in accordance with some embodiments.

FIG. 3 shows a wafer 300 (e.g., wafer 204 in FIG. 2), which can be used in accordance with FIG. 2's automatic test equipment 200. Like FIG. 1's wafer, wafer 300 includes multiple die 302 arranged in a grid-like layout, with scribe lines 304 running between neighboring die 302. Each die 302 includes an integrated circuit structure 306 made up of multiple semiconductor device to be tested.

To facilitate wireless testing, each die 302 also includes one or more wireless communication structures 308, such as inductive or capacitive elements. These wireless communication structures 308 are used to receive stimulus vectors and/or transmit stimulus test results with respect to wireless test head (210 in FIG. 2). In FIG. 3's embodiment, respective die include respective wireless communication structures 308. For example, the illustrated die each include a single wireless communication structure 308, although die could also include multiple communication structures 308 as well. In some embodiments wireless communication structures

308 could be shared between die, such that not every die has its own wireless communication structure 308.

To facilitate efficient power transfer to the wafer, wafer 300 also includes a power bus 310. In FIG. 3's embodiment, the power bus 310 includes first and second DC supply rails 312, 314 (e.g., VDD power rail and a VSS power rail, respectively). The first DC supply rail 312 includes a first trunk 312A coupled to a first landing region 316 (e.g., pad, bump, or ball) on an exposed surface of wafer 300. Branches 312B branch from the first trunk 312A, and ultimately couple to respective integrated circuit structures 306 (e.g., landing pad, bump, ball, or other landing region within integrated circuit structure 306). Similarly, the second DC supply rail 314 includes a second trunk 314A coupled to a second landing pad, bump, ball, or other landing region 318 on an exposed surface of wafer 300. Branches 314B branch from the second trunk 314A, and ultimately couple to respective integrated circuit structures 306 (e.g., landing pad, bump, ball, or other contact point within integrated circuit structure 306). In this way, the first and second DC supply rails 312, 314 are arranged to deliver operating power to the integrated circuit structures 306, as well as wireless communication structures 308.

In FIG. 3, the power bus 310 is arranged in the scribe lines 304 of the wafer 300. This configuration is especially advantageous in that the power bus 310 is only used during testing of the integrated circuit structures 306 prior to wafer dicing, and therefore putting the power bus 310 in the scribe lines free up valuable die real estate for other functions other than routing power during wafer testing. When the wafer is diced up, the power bus 310 will be lost, but at little or no expense from a manufacturing viewpoint.

Referring now to FIGS. 2-3 concurrently, automated testing is described. To carry out testing on wafer 300, automated test equipment 200 physically and electrically couples DC power conduits 218 (e.g., VDD and VSS power conduits) to landing regions 316, 318, for example by pressing needles or probes onto the landing regions 316, 318. Automated test equipment 200 then supplies the DC power supply 216 to the integrated circuit structures 306 and wireless communication structures 308 via the power conduit 218 and power bus 310, thereby providing power to the integrated circuit structures 306 and wireless communication structures 308. To run stimulus tests while the integrated circuit structures are powered, test vector stimulus module 220 looks up predetermined stimulus vectors or generates stimulus vectors on the fly. In either case, the stimulus vectors are provided to the wireless test head 210, and a transmitter in the wireless test head 210 wirelessly transmits RF signals indicative of the stimulus vectors toward the wafer 300. On the wafer 300, wireless communication structures 308 receive these RF signals and apply the stimulus vectors to the respective integrated circuit structures 306, which are still powered by DC power supply 216. After the stimulus vectors have been applied to the integrated circuit structures 306, the integrated circuit structures 306 provide test results back to the wireless communication structures 308, which in turn wirelessly transmit the test results to a receiver in the wireless test head 210. The test vector analysis module 222 compares the actual test results from the wafer 300 to expected results (e.g., provided by test vector stimulus module 220). As long as the actual test results are the same as (or within some maximum deviation of) the expected test results, the integrated circuit structures 306 are deemed to have proper functionality. If the test results differ from the expected test results for an integrated circuit, that integrated circuit can be "binned" or disposed of, depending on the extent of the difference.

Although embodiments have been described above with regards to the illustrated figures, it will be appreciated that a wide variety of other variations are also contemplated as falling within the scope of the present disclosure. For example, rather than RF wireless signals, other wireless signals could also be used. For example, infrared signals, optical signals, or ultrasonic signals could also be used to communicate wireless data.

Further, although FIG. 3 shows an example where all die on wafer 300 receive power from a power bus that stems from a single VDD landing region (e.g., 318) and a single VSS landing region (e.g., 316), in other embodiments multiple power buses and multiple VDD and VSS landing regions can be present. Such an example can help to limit current crowding and/or hot carrier effects, which may help improve device yields and reliability.

Figure 4:
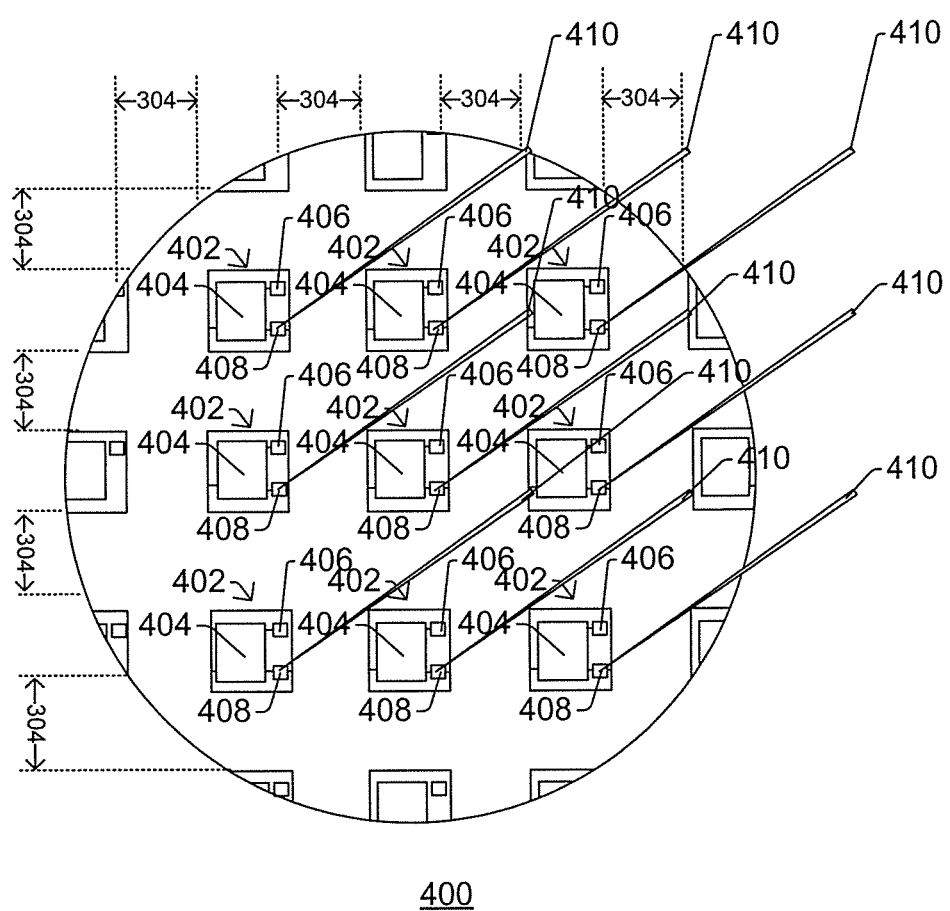
FIG. 4 shows a semiconductor wafer in accordance with some embodiments.

FIG. 4 shows another embodiment of a semiconductor wafer 400, which is ultimately diced into separate die regions 402, in accordance with some embodiments. In FIG. 4, each die 402 includes to-be-tested circuitry 404, an inductive or capacitive wireless communication structure 406 to exchange stimulus vectors and test results, and a landing region 408 to supply DC power to the to-be-tested circuitry 404 during testing. The landing region 408 has a size and location suitable to allow a conductive needle or conductive probe 410 to come into direct physical and electrical contact with the landing region. Thus, the landing region 408 provides a mechanism for a reliable power conduit 410 to come into physical contact with the wafer 400 and thereby supply DC power to the to-be-tested circuitry 404 while test vectors and results are wirelessly communicated via communication structure 406.

The wireless testing can be carried out on to-be-tested circuitry 404 on wafer 400 when manufacturing is complete (e.g., just before the wafer is diced up), or can be carried out at multiple steps during manufacturing. An advantage to carrying out multiple testing steps during manufacture is that it helps to more accurately identify where defects or faults arise in the manufacturing process. For example, consider an example where a first set of test vectors are applied after formation of a gate electrode (e.g., a polysilicon or metal gate electrode over a MOSFET device) and another set of test vectors are applied after formation of metal 1 interconnect over the gate electrode. If the first set of test vectors (gate electrode) have a high passage rate, but the second set of test vectors (metal 1 interconnect) have a low passage rate, it is reasonable to surmise there may be problems after the formation of gate electrode and prior to completion of the metal 1 interconnect (e.g., problems could be arising during formation of metal 1 interconnect). Armed with this knowledge, engineers can better diagnose and treat problems to limit problems and increase yields.

To allow for such multi-step testing, the landing region 408 can be formed on respective layers where tests are to be carried out. This allows for the test probes or needles 410 to physically contact the landing region 408 for each layer to supply DC power to the devices on the die during wireless testing. For example, if wireless testing is to be carried out immediately after formation of a gate electrode layer (e.g., metal gate or polysilicon layer), the gate electrode layer for each die can include a landing region that allows a conductive probe or needle to touch down and supply DC power to die via the landing region. Similarly, if testing is to be carried out immediately after formation of a metal 1 interconnect layer, the metal 1 interconnect layer can include a landing region that allows a conductive probe or needle to touch down and supply DC power to the landing region. Consequently, in the end integrated circuit, there may be multiple landing regions that are "buried" at different layers having different respective heights within the body of the die, and which are used only to provide DC power to the die at various stages during manufacture.

In some embodiments where multi-step testing is not utilized, the landing regions may be formed only on an exposed outer surface of the end die region. The landing regions being present on the exposed outer surface of the die provides for a mechanism to supply DC power to the dies during final testing of the die. After the wafer is diced up, the individual dies may be packaged and the landing regions on the exposed outer surface of the die may be coupled to a DC supply pin of the package (e.g., VDD or VSS).

Figure 5:
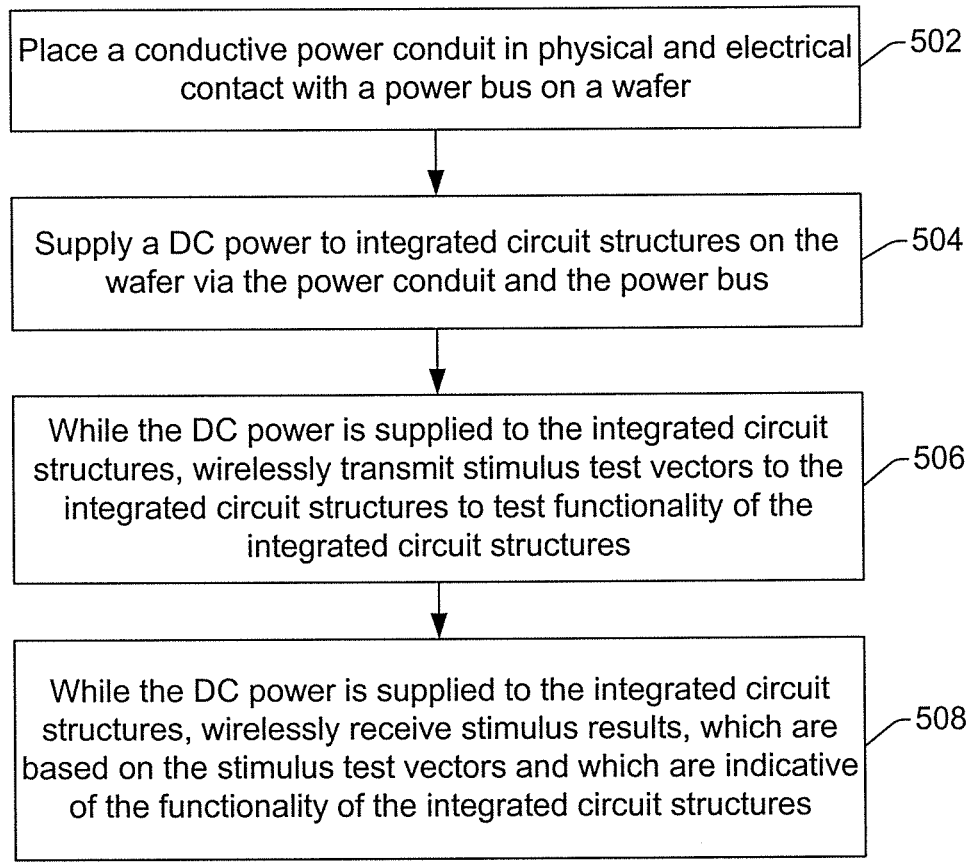
FIG. 5 shows a method in flowchart format in accordance with some embodiments.

FIG. 5 shows an exemplary method of automated testing that uses wireless probing for exchanging stimulus vectors and test results and which uses a conductive power conduit for providing power to a wafer undergoing testing. Although the steps of this method are illustrated as blocks or acts, it will be appreciated that the disclosure is not limited to the illustrated embodiment. For example, the steps can be broken into additional steps or can be combined into fewer steps, and the order of such steps can be different from those illustrated.

FIG. 5's method starts at 502 when a conductive power conduit is placed in physical and electrical contact with a power bus on a wafer. The conductive power conduit can take the form of a wire, needle, probe, or other conductive body, and may come into physical contact with balls, bumps or landing regions on the wafer surface which are an extension of the power bus. In some embodiments, more than one conductive power conduit may be applied to the wafer concurrently. Such an approach may limit current crowding, hot carrier effects, and the like, although it may also use slightly more area on the wafer.

In 504, a DC power is supplied to the integrated circuit structures on the wafer via the power conduit and power bus. For example, in some embodiments a VDD voltage of approximately 1 volt to approximately 5 volts and a VSS voltage of approximately 0 volts are applied to a VDD power rail and a VSS power rail, respectively, of the power bus.

In 506, while the DC power is supplied to the integrated circuit structures, stimulus test vectors are wireless transmitted to the integrated circuits structures to test functionality of the IC structures. Stimulus test vectors can be digital or analog test patterns.

In 508, while the DC power is supplied to the IC structures, the automated test equipment wirelessly receives stimulus test results from the integrated circuit structures on wafer, where the test results are based on the transmitted stimulus vectors and are indicative of the functionality of the integrated circuit structures.

Thus it will be appreciated that some embodiments relate to an integrated circuit. The integrated circuit includes an inductive or capacitive wireless communication structure located on a die region of the integrated circuit. This wireless communication structure is configured to wirelessly receive a test stimulus vector to test circuitry on the die region. The integrated circuit also includes a landing region having a size and location suitable to allow a conductive needle or conductive probe to come into direct physical and electrical contact with the landing region. The landing region provides a DC power supply to the circuitry on the die region while the test stimulus vector is wirelessly received.

Other embodiments relate to a semiconductor wafer. The wafer includes a plurality die regions, wherein respective die regions include respective integrated circuit structures corresponding thereto. Scribe lines are arranged between neighboring die regions. A power bus is arranged in a scribe line and coupled to the respective integrated circuit structures in the plurality of die regions. Respective inductive or capacitive communication structures are arranged on respective die regions, wherein an inductive or capacitive communication structure on a die region is configured to wirelessly receive a test stimulus vector to an integrated circuit structure on the die region.

Still other embodiments relate to a method of automated testing for a semiconductor wafer. In this method, a conductive power conduit is placed in physical and electrical contact with a conductive power bus on the wafer. A DC power is then supplied to integrated circuit structures on the wafer via the conductive power conduit and the power bus. While the DC power is supplied to the integrated circuit structures, stimulus test vectors are wirelessly transmitted to the integrated circuit structures to test functionality of the integrated circuit structures.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An integrated circuit disposed on a semiconductor substrate, comprising:
    an inductive or capacitive wireless communication structure located on a die region of the integrated circuit and configured to wirelessly receive a test stimulus vector to test circuitry on the die region; and
    a plurality of landing regions located on the die region and buried at different layers having different respective heights as measured from an uppermost surface of the semiconductor substrate, wherein the respective landing regions have sizes and locations suitable to allow a conductive needle or conductive probe to come into direct physical and electrical contact therewith to provide a DC power supply to the circuitry on the die region at various stages during manufacture of the integrated circuit while the test stimulus vector is wirelessly received.

2. The integrated circuit of claim 1, wherein a landing region is located on an exposed surface of the die region.

3. The integrated circuit of claim 1, wherein a landing region is located in an internal and un-exposed region of the die region.

4. The integrated circuit of claim 3, wherein the landing region is adapted to provide power to a device structure on the die region prior to dicing of the semiconductor substrate.

5. The integrated circuit of claim 2, further comprising:
    an integrated circuit package around the die region to protect the die region.

6. The integrated circuit of claim 5, wherein a pin or contact of the integrated circuit package is coupled to a landing region to provide DC power to the circuitry of the die region.

7. A semiconductor wafer, comprising:
   a plurality of die regions, wherein respective die regions include respective integrated circuit structures corresponding thereto;
   scribe lines arranged on the semiconductor wafer between neighboring die regions;
   a power bus arranged in a scribe line on the semiconductor wafer and extending continuously between two or more of the plurality of die regions to concurrently couple a DC power supply to the two or more of the plurality of die regions; and
   respective inductive or capacitive communication structures arranged on respective die regions; wherein an inductive or capacitive communication structure on a die region is configured to wirelessly receive a test stimulus vector to an integrated circuit structure on the die region.

8. The semiconductor wafer of claim 7, wherein an inductive or capacitive communication structure on a die region is configured to wirelessly transmit a test stimulus result corresponding to a test stimulus vector applied to an integrated circuit structure on the die region.

9. The semiconductor wafer of claim 7, further comprising:
   a landing region having a size and location suitable to allow a conductive needle or conductive probe to come into direct physical and electrical contact with the landing region to provide a DC power supply to one or more die regions on the semiconductor wafer while the test stimulus vector is wirelessly received.

10. The semiconductor wafer of claim 9, wherein, after the die region is diced from a semiconductor wafer, the landing region is located on an exposed surface of the die region.

11. The semiconductor wafer of claim 7, wherein, after the die region is diced from a semiconductor wafer, the landing region is located in an internal and un-exposed region of the die region.

12. The semiconductor wafer of claim 7, further comprising:
   a plurality of landing regions buried at different layers having different respective heights as measured from an uppermost surface of the semiconductor wafer.

13. The semiconductor wafer of claim 12, wherein the respective landing regions have sizes and locations suitable to allow a conductive needle or conductive probe to come into direct physical and electrical contact therewith.

14. The semiconductor wafer of claim 12, wherein the landing regions are coupled to respective die regions on the semiconductor wafer to provide a DC power supply to the respective die regions while the test stimulus vector is wirelessly received.

15. A method of automated testing for a semiconductor wafer, comprising:
   placing a conductive power conduit in physical and electrical contact with a power bus on the wafer, wherein the power bus is arranged in a scribe line, which separates neighboring rows or neighboring columns of integrated circuit structures from one another, and wherein the power bus extends continuously between multiple integrated circuit structures on the wafer to electrically couple the multiple integrated circuit structures to one another;
   concurrently supplying a DC power to the multiple integrated circuit structures on the wafer via the conductive power conduit and the power bus; and
   while the DC power is supplied to the integrated circuit structures, wirelessly transmitting stimulus test vectors to wireless communication structures on the integrated circuit structures to test functionality of the integrated circuit structures.

16. The method of claim 15, further comprising:
   while the DC power is supplied to the integrated circuit structures, wirelessly receiving stimulus results, which are based on the stimulus test vectors, and which are indicative of the functionality of the integrated circuit structures.

17. The method of claim 15, wherein wireless transmission comprises radio frequency (RF) transmission, optical transmission, or ultrasonic transmission.

* * * * *